United States Patent [19]

Saenger et al.

[11] Patent Number: 4,576,902

[45] Date of Patent: Mar. 18, 1986

[54] PROCESS OF MAKING AND USING A POSITIVE WORKING PHOTOSENSITIVE FILM RESIST MATERIAL

[76] Inventors: Dietrich Saenger, 16 A Lorcher Ring, 6710 Frankenthal; Helmut Barzynski, 49 An der Ameisenhalde, 6702 Bad Durkheim 1, both of Fed. Rep. of Germany

[21] Appl. No.: 678,050

[22] Filed: Dec. 4, 1984

Related U.S. Application Data

[60] Division of Ser. No. 522,267, Aug. 11, 1983, which is a continuation of Ser. No. 415,455, Sep. 7, 1982, abandoned, which is a continuation of Ser. No. 283,910, Jul. 7, 1981, abandoned, which is a continuation of Ser. No. 154,895, May 30, 1980, abandoned.

[30] Foreign Application Priority Data

Jun. 5, 1979 [DE] Fed. Rep. of Germany ....... 2922746

[51] Int. Cl.$^4$ ................................................ G03C 5/00
[52] U.S. Cl. .................................. 430/326; 156/308.2; 156/324.4; 430/270; 430/271; 430/275; 430/311
[58] Field of Search ............... 430/269, 270, 271, 281, 430/311, 372, 325, 326, 275; 427/44, 54.1; 156/308.2, 309.9, 324.4

[56] References Cited

U.S. PATENT DOCUMENTS

| | | | |
|---|---|---|---|
| 3,849,137 | 1/1974 | Barzynski et al. | 430/281 |
| 4,006,013 | 2/1977 | McLaughlin et al. | 430/912 |
| 4,035,139 | 7/1977 | Hayashi et al. | 430/281 |

FOREIGN PATENT DOCUMENTS 2309062  9/1975  Fed. Rep. of Germany .

*Primary Examiner*—Jack P. Brammer

[57] ABSTRACT

A positive working photosensitive film resist material suitable for multiple image-wise exposure comprises, on a dimensionally stable base film, a photosensitive coating which contains (a) a polymer which possesses aromatic or hetero-aromatic o-nitrocarbinol ester groups (for example o-nitrobenzyl acrylate units) and which can be washed out, after exposure, with an alkaline solvent, and (b) a transparent plasticizer compatible with (a). The product may be used as photopolymer dry film resist material in the production of electrical conductor boards, chemically milled fine-line parts, and identification plates.

7 Claims, No Drawings

PROCESS OF MAKING AND USING A POSITIVE WORKING PHOTOSENSITIVE FILM RESIST MATERIAL

This is a division of application Ser. No. 522,267, filed Aug. 11, 1983, which is a continuation of Ser. No. 415,455, filed Sep. 7, 1982 now abandoned, which is a continuation of Ser. No. 283,910 filed Jul. 7, 1981 now abandoned, which is a continuation of Ser. No. 154,895 filed May 30, 1980, now abandoned.

The present invention relates to positive working photosensitive film resist material, in particular photopolymer dry film resist material, which is suitable for lamination, in the dry state, onto metal and other surfaces, and which contains a polymer which possesses o-nitrocarbonol ester groups.

Photopolymer dry film resist materials, also referred to for brevity as dry film resists, and various combinations of chemical compounds for use in dry resists which can be laminated are known per se. The dry resists described, for example, in German Published Application DAS 1,522,515 or German Laid-Open Application DOS 2,602,410 are photocrosslinkable and are suitable for lamination in the dry state onto metal and other surfaces with the simultaneous application of pressure and heat. When such dry resists are subjected to image-wise exposure, they give a system which in the resist field is usually referred to as negative working. In this case, those areas which are exposed through the transparent parts of the image-bearing transparency become insoluble, whilst the unexposed areas remain relatively unchanged and can be removed by washing out with suitable solvents. Accordingly, the image produced in the dry resist is a reversal of the original.

It is sometimes desirable to have available a positive working resist material, for example if a positive original is available and it is more economical to use this original rather than first to produce a negative transparency therefrom. Furthermore, several successive exposures can be carried out with a positive-working resist, provided the areas which have not been washed out retain their photosensitivity. Thus, in the manufacture of conductor boards it is possible to pass the boards through several different electroplating baths and/or etching baths, for example first through a copper etching bath and then, after a further imagewise exposure using a different transparency, through a gold electroplating bath.

German Laid-Open Applications DOS 2,028,903 and DOS 2,236,941 describe o-quinone-diazide compounds for positive-working resist materials, which on exposure react to form alkali-soluble photolysis products. However, the materials have a short shelf life, and when exposed to heat, such as during lamination, suffer decomposition —due to the thermal instability of the diazide groups— accompanied by elimination of nitrogen. Furthermore, metal surfaces to which these materials have been laminated must be rapidly further processed, since the decomposition of the diazide group is catalyzed by heavy metals and heavy metal salts (for example in electroplating baths). Furthermore, o-quinonediazide derivatives are not stable to aqueous alkalis, which further restricts their use.

U.S. Pat. No. 3,380,825, German Published Application DAS 2,338,223 and German Laid-Open Application DOS 2,710,417 contain further proposals for obtaining positive-working resists by image-wise inhibition of negative-working photopolymer resists. These processes however require 2 exposures and are furthermore extremely involved. Either a gaseous inhibitor is used, or copying apparatus employing different radiation intensities and/or wavelengths must be employed. Multiple exposures are not possible by these processes.

German Laid-Open Application DOS 2,150,691 describes photosensitive coating materials which consist of polymers containing o-nitrocarbinol ester groups and which, after exposure, can be washed out with an alkaline solvent. The coating materials are employed, in particular, for positive-working planographic printing plates and for liquid resists. Further, German Laid-Open Application DOS 2,309,062 proposes producing photopolymer dry film resist materials using o-nitrocarbinol ester coatings. However, the systems described there are negative-working.

It is an object of the present invention to provide a positive-working photosensitive material, which is insensitive to thermal stress and hence has a good shelf life, for photopolymer dry film resists, which material is so sensitive both to metal surfaces and to electroplating baths and etching baths that it retains its photosensitivity and can therefore be used for multiple exposures.

We have found that this object is achieved and that a positive-working photosensitive film resist material consisting of a dimensionally stable base film and a photosensitive coating applied thereto, with or without a strippable protective film, exhibits the desired properties if the photosensitive coating consists essentially of a polymer which has a mean molecular weight greater than 500, contains, chemically bonded in the molecule, not less than 5% by weight, based on the polymer molecular weight, of aromatic or hetero-aromatic o-nitrocarbinol ester groups of the formula (I)

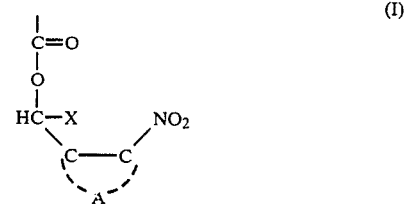

where A is an aromatic or hetero-aromatic, unsubstituted or substituted ring system with from 5 to 14 ring members and X is hydrogen, alkyl of 1 to 8 carbon atoms or unsubstituted or substituted aryl or aralkyl, and can, after exposure, be washed out with an alkaline solvent or solvent mixture, and a plasticizing compound which is compatible with the polymer and is transparent in the wavelength range of from 300 to 400 nm, this compound being present in such an amount that the optical density of the resist coating at a wavelength of 360 nm is from 0.05 to 3 and that the coating softens sufficiently, on lamination at a conventional processing temperature of above 40° C., that it can be laminated onto metal surfaces.

The photosensitive film resist materials according to the invention are outstandingly suitable for use as dry film resists for the production of electrical conductor boards, chemically milled fine-line parts, and identification plates.

As regards the polymers containing the o-nitrocarbinol ester groups of the formula (I), and their preparation, reference may be made to German Laid-Open Application DOS 2,150,691 corresponding to British Patent 1,404,497 and U.S. Pat. No. 3,849,137 (which are herein incorporated by reference). Preferably, o-nitrobenzyl alcohol is used as the carbinol on which the o-nitrocarbinol ester groups are based, whilst the polymer radicals bearing these ester groups are radicals of polycarboxylic acids, e.g. a copolymer of an o-nitrocarbinol ester of acrylic acid, methacrylic acid, maleic acid and/or fumaric acid.

Preferred plasticizers are tricresyl phosphate and liquid polyesters obtained from aliphatic dicarboxylic acids and bifunctional glycols, in particular polyesters which are obtained from adipic acid and 1,2-propylene glycol or butane-1,4-diol and which have a viscosity of 1,000 to 15,000 cp, and n-butyl benzyl phthalate.

Soluble dyes, pigments and/or flow aids may be added to the photosensitive resist coatings. For example, Sudan dyes, azo dyes, phthalocyanine dyes, disperse dyes, eosin, crystal violet or malachite green have proved suitable as dyes. Dyes which on ultraviolet exposure change their color reversibly or irreversibly are particularly advantageous. For example, Sudan dyes or azo dyes are bleached out image-wise by added photoinitiators, e.g. benzoin ethers or benzophenone. Silicone oils are very suitable flow aids.

Sensitizers which improve the photosensitivity and spectral sensitivity of the polymers may also be added to the photosensitive coatings. Examples of such sensitizers are xanthene dyes, e.g. fluoroscein, eosin and rhodamine S, and triplet energy transfer agents, as described, for example, by N. J. Turro, Molecular Photochemistry, W. A. Benjamin Inc., New York, 1967, page 132.

To produce the novel photosensitive film resist materials, the individual components of the photosensitive coating can be mixed in a suitable solvent, e.g. acetone, ethyl acetate or methylene chloride, after which the mixture is applied as a coating of uniform thickness (from 0.005 to 1 mm) to a dimensionally stable base film, preferably a polyethylene terphthalate film, by conventional methods, such as casting, and the solvent is evaporated off, leaving the photosensitive resist coating on the base film. After evaporation of the solvent, the resist coatings are frequently still somewhat soft and tacky. To facilitate storage and further processing, a protective film is applied; polyethylene and polypropylene films are particularly suitable for this purpose. Of course, it is also possible to cast films from solution onto the resist coating, for example to apply a coating of polyvinyl alcohol from aqueous solution. The finished positive working photosensitive film resist material is then laminated, after peeling off the protective film, onto the surface to be processed, for example a metal surface, with the application of heat and pressure, and is exposed imagewise to ultraviolet light, either through the base film or after removing the preferably strippable base film. The areas which have become alkali-soluble as a result of the exposure are subsequently washed out with an alkaline developer and the uncovered surfaces, such as metal surfaces, are etched and/or treated further by electroplating methods. After finishing the article, the unexposed parts of the photosensitive resist can be removed entirely by treatment with a polar organic solvent, e.g. acetone, ethyl acetate or ethylglycol monobutyl ether.

A particular advantage is the total stability of the photosensitive polymers, containing o-nitrocarbinol ester groups, e.g. o-nitrobenzyl groups, to thermal stress and to metal surfaces, metal salt solutions and strongly alkaline media. The resist material is exposed to these influences during lamination, for example onto copper surfaces, and during the subsequent processing steps, such as etching and electroplating. Because of this resistance, it is possible, the photopolymer dry film resist system according to the invention, in contrast to systems based on diazo-oxide and all negative-working systems, to re-expose the image areas which remain after the material has passed through the steps of developing, etching and electroplating. The possibility of multiple exposure opens up new applications for photoresist material, for example the gold electroplating of edge connectors or the production of printed circuits which have, within the conductor lines, contacts, plated with noble metals, for pushbutton switches or wiping contact switches.

In the Examples which follow, parts and percentages are by weight, unless stated otherwise. Parts by volume bear the same relation to parts by weight as the liter to the kilogram.

EXAMPLE 1

(Preparation of a photosensitive terpolymer)

40 parts of o-nitrobenzyl acrylate, 59 parts of methyl methacrylate, 1 part of acrylic acid and 1 part of azodiisobutyronitrile are dissolved in 150 parts by volume of ethyl acetate. Before refluxing the mixture, the atmospheric oxygen is displaced by flushing with nitrogen. The mixture is then refluxed for 24 hours whilst being stirred, and 1 part of azodiisobutyronitrile is added after 8 hours and again after 16 hours. The terpolymer is precipitated by the dropwise addition of the polymer solution to methanol and is dried in an oven under reduced pressure at 40° C. Yield: 96 parts of a white, flocculant powder. Nitrogen content: 2.8% (corresponding to 41.2% of o-nitrobenzyl acrylate). K value measured by the method of H. Fikentscher (Cellulose-Chemie, 30 (1931), 58): 21 (1% strength solution in ethyl acetate). Acid content: 1.05% of acrylic acid.

The polymer solution obtained can also be employed directly for the production of photoresists.

Copolymers of different compositions can be prepared in a similar manner. Depending on the nature and amount of the comonomers, copolymers with glass transition temperatures $T_g$ which can be varied within wide limits, as required, are obtained. By way of illustration, the Table which follows lists some o-nitrobenzyl acrylate polymers, with their glass transition temperatures.

| o-NB acrylate % | Comonomers % | | % | $T_g$ °C. |
|---|---|---|---|---|
| 100 | — | | | about 25 |
| 80 | 20 | MMA | | 35 |
| 60 | 40 | MMA | | 53 |
| 40 | 60 | MMA | | 70 |
| 20 | 80 | MMA | | 84 |
| — | 100 | MMA | | 105 |
| 40 | 59 | MMA | 1 AA | 65 |
| 40 | 60 | AN | | 53 |
| 40 | 60 | t-BA | | 40 |
| 40 | 50 | MMA | 10 t-BA | 60 |
| 40 | 40 | MMA | 20 | 51 |

| o-NB acrylate | Comonomers | | $T_g$ |
|---|---|---|---|
| % | % | % | °C. |
| 40 | 30 MMA | 30 | 54 |

MMA = methyl methacrylate
AN = acrylonitrile
o-NB acrylate = o-nitrobenzyl acrylate
t-BA = tert.-butyl acrylate
AA = acrylic acid

EXAMPLE 2

(Preparation of a photopolymer dry film resist)

A solution of 40 parts of the photosensitive copolymer of Example 1, 18 parts of a liquid polyester of adipic acid and butanediol (viscosity 7,000 cp at 20° C.), 0.58 part of benzil dimethyl ketal and 0.18 part of the dye Solvent Black 3, C.I. 26,153, in 160 parts by volume of ethyl acetate is filtered through a 1.5 μm membrane filter and then applied uniformly, by means of a knife coater, to a 25 μm thick, heat-set polyethylene terephalate film. The thickness of the wet coating is so chosen that, after drying, a 10 to 30 μm thick resist coating results. For protection against soiling, etc., the photosensitive resist coating is covered with a 25 μm thick low pressure polyethylene film. The photopolymer dry film resist is edge-trimmed and wound onto a paperboard core.

EXAMPLE 3

(Production of a conductor board (substractive process))

Prior to use as a dry film resist, the polyethylene protective film is peeled off in a commercial laminator and the positive working resist is laminated onto prebrushed and thoroughly degreased, copper-plates glass-fiber-reinforced epoxy resin boards at 100 to 120° C., at a speed of 0.5 to 1.5 m./min. A copper-plated board thus coated with the resist is exposed for 2 minutes through a photographic positive and through the base film, in a conventional exposure apparatus. This bleaches out the exposed areas, producing a good contrast with the unexposed areas. This effect intensifies on storage, so that confusion with unexposed plates is possible. The polyester film is then peeled off and the exposed areas are developed in the course of 1 to 1.5 minutes with a developer mixture consisting of 81% of water, 16% of 2-butylethanol and 3% of triethanolamine. A blue, sharp, well defined relief image is obtained which is freed from residual developer using a jet of compressed air. Thereafter, the uncovered copper layer is etched away in a commercial etching bath at 40 to 50 ° C. and the board is then rinsed wih water and dried. The photosensitive resist exhibits very good resistance to both acid etchants, e.g. $FeCl_3$, $(NH_4)_2S_2O_8$ or $CuCl_2$, and alkaline etchants, e.g. ammoniacal baths. Next, the resist image is dissolved away by washing with a polar solvent (acetone or ethyl acetate). The conductor lines have straight vertical sidewalls, with no undercutting. The photosensitive resist is also very suitable for producing plated through-hole boards, since the holes are tented over during all the process steps.

EXAMPLE 4

(Stepwise multiple exposure)

A copper-plated baseplate, to which a positive working resist as described in Example 3 has been laminated, is divided up into 3 zones. First, zone 1 is exposed as described above (zones 2 and 3 being covered with black masking material), developed and etched. Masking is only effected during the exposure step; in all subsequent operations the entire plate is treated.

In zone 1, a resist image of the positive transparency is obtained, whilst zones 2 and 3 are still covered with resist over their entire surface. Next, zones 1 and 3 are masked out and zone 2 is exposed through a positive transparency. After passing through all the process steps, the board obtained has an etched conductor ine pattern in zones 1 and 2, but in zone 3 is still covered over its entire surface by the originally applied resist. After masking out zones 1 and 2, zone 3 is exposed. Though this zone has been subjected twice to developing and twice to etching, a cleanly developed image results which permits just as sharp etching as in the two preceding steps. After stripping the remaining resist with acetone, the board obtained shows in all 3 zones etched images corresponding exactly to the particular positive transparency employed.

EXAMPLE 5

(Plating resist)

A copper-plated baseplate to which a positive resist as described in Example 3 has been laminated is exposed for 3 minutes through a negative transparency, developed and then dried for 10 minutes at 80° C. 5 μm of nickel and 3 μm of gold are successively deposited on the plate in a plating line, using commercial plating baths. The residual resist material is dissolved away by washing with acetone and the uncovered copper is etched away with a 20 per cent strength $(NH_4)_2S_2O_8$ solution. A flawless conductor board having conductor lines with straight vertical sidewalls is obtained. The film resist can be used as a plating resist in the image-wise deposition of a plurality of other metals, for example in the plating of copper or tin or tin/lead alloys.

EXAMPLE 6

(Etch resist and plating resist obtained by double exposure)

In the production of boards which require gold-plated contacts within the conductor lines, for example for wiping contact switches, it is normally necessary either to use a negative working resist twice or to effect screen printing twice. The positive working photosensitive film resist according to the invention, which remains photosensitive even after contact with electroplating baths containing heavy metal salts, offers an elegant solution. It enables the image-wise deposition of different metals to be effected, or can be used as an etch resist and, after a second exposure, as a plating resist, with only a single masking step.

A copper-plated baseplate to which a film resist produced as described in Example 3 has been laminated is first exposed through a positive transparency, after which developing is effected and the uncovered copper surfaces are etched away. After renewed exposure through a photographic positive, developing results in the image-wise uncovering of the wiping contacts on which gold is electroplated. The portions of the resist which remain are then dissolved away by rinsing with acetone, so that subsequent soldering can be carried out without any trouble.

EXAMPLE 7

(Stability of the film resist to etchants, plating solutions and thermal stess)

For a comparison of the stabilities, copper-coated epoxy resin boards are coated with two positive working resist materials of different chemical composition:
Sample A: resist material according to the invention
Sample B: photosensitive resist based on an o-naphthoquinone-diazide-5-sulfonic acid/novolac derivative.

The exposed boards are then heated at 140° C., and also stored in aqueous alkali (5 per cent strength NaOH) and in a solution containing a heavy metal salt (electroplating bath). The results obtained are summarized in the Table below.

| Sample | Heat treatment at 140° C. 1 h | 24 h | 2 hours storage in 5 percent strength NaOH | 2 hours storage in Cu bath | Ag bath |
|---|---|---|---|---|---|
| A | ++ | ++ | ++ | ++ | ++ |
| B | O | O | − | O | O |

++ Resist completely photosensitive, film not attacked
O Resist no longer photosensitive
− Resist completely dissolved away The results show the outstanding heat stability of the photosensitive film resist material according to the invention, and its resistance to processing chemicals.

EXAMPLE 8

A conductor board as described in Example 3, but the resist image is not removed with a polar organic solvent; instead, after a further uniform exposure for two minutes, it is washed away with the first aqueous developer mixture described in Example 3. This procedure makes it possible to work with only one aqueous developer mixture and with only one washout unit (spray washer).

We claim:

1. A process for producing a resist pattern on a substrate which comprises:

laminating to a permanent support a positive working photosensitive dry film resist wherein the photosensitive material of the resist consists essentially of a polymer which has a mean molecular weight greater than 500, contains, chemically bonded in the molecule, not less than 5% by weight, based on the polymer molecular weight, of aromatic or hetero-aromatic o-nitrocarbinol ester groups of the formula I

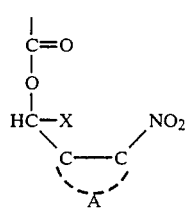

where A is an aromatic or hetero-aromatic, unsubstituted or substituted ring system with from 5 to 14 ring members and X is hydrogen, alkyl of 1 to 8 carbon atoms or unsubstituted or substituted aryl or aralkyl, and can, after exposure, be washed out with an alkaline solvent or solvent mixture, and a plasticizing compound which is compatible with the polymer and is transparent in the wavelength range of from 300 to 400 nm, this compound being present in such an amount that the optical density of the film at a wavelength of 360 nm is from 0.05 to 3 and that the film softens sufficiently, on lamination at a conventional processing temperature of above 40° C., that it can be laminated to the permanent support;

exposing the laminated resist film image-wise to ultraviolet light; and washing out the exposed areas of the resist with an alkaline developer.

2. The process of claim 1, wherever the resist includes a temporary base film which is removed after the resist is laminated to the permanent support.

3. The process of claim 1, wherein the permanent support is a metal support.

4. The process of claim 1, where the temporary film is polyethylene terephthalate.

5. A process for producing a positive working dry film resist which comprises:

mixing in a solvent a photosensitive coating composition consisting essentially of a polymer which has a mean molecular weight greater than 500, contains, chemically bonded in the molecule, not less than 5% by weight based on the polymer molecular weight, of aromatic or hetero-aromatic o-nitrocarbinol ester groups of the formula I

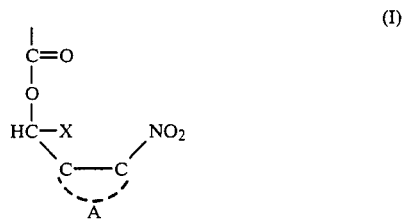

where A is an aromatic or hetero-aromatic, unsubstituted or substituted ring system with from 5 to 14 ring members and X is hydrogen, alkyl of 1 to 8 carbon atoms or unsubstituted or substituted aryl or aralkyl, and can, after exposure, be washed out with an alkaline solvent or solvent mixture, and a plasticizing compound which is compatible with the polymer and is transparent in the wavelength range of from 300 to 400 nm, this compound being present in such an amount that the optical density of the film at a wavelength of 360 nm is from 0.05 to 3 and that film softens sufficiently, on lamination at a conventional processing temperature of above 40° C., that it can be laminated to the permanent support;

applying the solution to a dimensionally stable base film to form a coating having a uniform thickness of from 0.005 to 1 mm;

evaporating the solvent to produce a solid photosensitive film; and laminating the film to a permanent support.

6. The process of claim 5 wherein the permanent support is a metal support.

7. The process of claim 6 wherein the dimensionally stable base film is a polyethylene terephalate film.

* * * * *